(12) United States Patent
Bellorado et al.

(10) Patent No.: US 11,762,731 B2
(45) Date of Patent: Sep. 19, 2023

(54) CODEWORD REDUNDANCY

(71) Applicant: Seagate Technology LLC, Fremont, CA (US)

(72) Inventors: Jason Bellorado, San Jose, CA (US); Deepak Sridhara, Longmont, CO (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 17/525,443

(22) Filed: Nov. 12, 2021

(65) Prior Publication Data

US 2023/0153196 A1    May 18, 2023

(51) Int. Cl.
*G06F 11/10* (2006.01)
*H03M 13/29* (2006.01)

(52) U.S. Cl.
CPC ..... *G06F 11/1004* (2013.01); *H03M 13/2909* (2013.01)

(58) Field of Classification Search
None
See application file for complete search history.

(56) References Cited

U.S. PATENT DOCUMENTS

| | | |
|---|---|---|
| 5,563,746 A | 10/1996 | Bliss |
| 6,043,945 A | 3/2000 | Tsuboi et al. |
| 6,101,227 A | 8/2000 | Glover |
| 6,282,670 B1 | 8/2001 | Rezaul et al. |
| 6,292,317 B1 | 9/2001 | Alexander |
| 6,640,145 B2 | 10/2003 | Hoffberg et al. |
| 6,731,442 B2 | 5/2004 | Jin et al. |
| 6,757,122 B1 | 6/2004 | Kuznetsov et al. |
| 7,000,168 B2 | 2/2006 | Kurtas et al. |
| 7,072,129 B1 | 7/2006 | Cullen et al. |
| 7,139,145 B1 | 11/2006 | Archibald et al. |
| 7,170,703 B1 | 1/2007 | Egan |
| 7,266,750 B1 | 9/2007 | Patapoutian et al. |
| 7,379,256 B2 | 5/2008 | McMurtrey |
| 7,415,651 B2 | 8/2008 | Argon |
| 7,646,556 B1 | 1/2010 | Kose et al. |

(Continued)

OTHER PUBLICATIONS

A. S. Ramasamy and P. Karantharaj, "File system and storage array design challenges for flash memory," 2014 International Conference on Green Computing Communication and Electrical Engineering (ICGCCEE), 2014, pp. 1-8, doi: 10.1109/ICGCCEE.2014.6922453. (Year: 2014).*

(Continued)

*Primary Examiner* — Daniel F. McMahon
(74) *Attorney, Agent, or Firm* — Christian W. Best

(57) ABSTRACT

Systems and methods are disclosed for an improved utilization of parity within a data storage device, and manufacturing methods thereof. In some embodiments, a data storage device can implement an improved codeword redundancy process that can be utilized for data storage locations which were not previously scanned for defects. In some embodiments, a data storage device can implement an improved codeword redundancy process to store write data to a data storage location without having to perform a read operation prior to storing the write data to the storage location. The improved codeword redundancy process can include various methods of storing or updating an outer code codeword for the data to be stored.

20 Claims, 10 Drawing Sheets

(56) References Cited

U.S. PATENT DOCUMENTS

| | | |
|---|---|---|
| 7,653,847 B1 | 1/2010 | Liikanen et al. |
| 7,656,763 B1 | 2/2010 | Jin et al. |
| 7,774,680 B2 | 8/2010 | Earhart et al. |
| 7,817,363 B2 | 10/2010 | Obrien et al. |
| 7,839,588 B1 | 11/2010 | Dang et al. |
| 7,880,987 B2 | 2/2011 | Belmont et al. |
| 7,929,234 B1 | 4/2011 | Boyle et al. |
| 3,004,785 A1 | 8/2011 | Tsai et al. |
| 3,014,094 A1 | 9/2011 | Jin |
| 8,094,396 B1 | 1/2012 | Zhang et al. |
| 8,120,868 B2 | 2/2012 | Bi et al. |
| 8,169,725 B2 | 5/2012 | Jun |
| 8,176,400 B2 | 5/2012 | Tan et al. |
| 8,194,338 B1 | 6/2012 | Zhang |
| 8,489,979 B2 | 7/2013 | Rub |
| 8,565,053 B1 | 10/2013 | Chung |
| 8,572,457 B2 | 10/2013 | Rub et al. |
| 8,640,012 B2 | 1/2014 | Ling et al. |
| 8,675,297 B2 | 3/2014 | Wilson et al. |
| 8,683,277 B1 | 3/2014 | Varnica et al. |
| 8,694,841 B1 | 4/2014 | Chung et al. |
| 8,782,505 B2 | 7/2014 | Rub |
| 8,826,110 B2 | 9/2014 | Jin et al. |
| 8,843,813 B2 | 9/2014 | Tan |
| 8,964,320 B1 | 2/2015 | Hu et al. |
| 9,015,549 B2 | 4/2015 | Rub et al. |
| 9,042,045 B1 | 5/2015 | Dang et al. |
| 9,048,879 B1 | 6/2015 | Yang et al. |
| 9,244,752 B2 | 1/2016 | Qin et al. |
| 9,396,062 B1 | 7/2016 | Sridhara et al. |
| 9,472,223 B1 | 10/2016 | Mendonsa et al. |
| 10,135,567 B2 | 11/2018 | Vojcic et al. |
| 10,140,180 B1 * | 11/2018 | Sridhara ............... H03M 13/29 |
| 10,410,736 B2 | 9/2019 | Chen et al. |
| 10,437,674 B1 * | 10/2019 | Sridhara ............. G06F 11/1076 |
| 10,574,270 B1 * | 2/2020 | Sridhara ................ G06F 3/064 |
| 10,721,018 B2 | 7/2020 | Brittner et al. |
| 10,776,263 B2 | 9/2020 | Williams |
| 11,042,439 B1 | 6/2021 | Sridhara et al. |
| 11,200,911 B1 * | 12/2021 | Burton .................. G11B 5/012 |
| 2008/0262643 A1 | 10/2008 | Creigh et al. |
| 2011/0314354 A1 * | 12/2011 | Fillingim ............ G06F 11/1048 714/760 |
| 2012/0304037 A1 * | 11/2012 | Reddy ............... H03M 13/2909 714/763 |

OTHER PUBLICATIONS

Tzi-Dar Chiueh; Pei-Yun Tsai; I-Wei Lai, "Error-Correcting Codes," in Baseband Receiver Design for Wireless MIMO-OFDM Communications , IEEE, 2012, pp. 69-94, doi: 10.1002/9781118188194. ch4. (Year: 2012).*

\* cited by examiner

CODEWORD REDUNDANCY

SUMMARY

In certain embodiments, an apparatus may comprise a control circuit configured to perform a parity generation process including receive a write command to store first specific data to a data storage location, generate first parity codes for each data sector of the first specific data, the first parity codes including an inner code (IC) for each data sector of the first specific data, determine if there has been a prior write to the data storage location. When there has not been a prior write to the data storage location, the parity generation process can further include generate an additional parity code based on the first specific data, and store the first specific data, first parity codes, and the additional parity code to the data storage location.

In certain embodiments, a method may include performing, at a control circuit within a data storage device, an outer code (OC) codeword generation process including determining if there has been a prior write to a specific data storage location and, when there has not been a prior write to the specific data storage location, generating the OC codeword based on first data to be stored at the specific data storage location.

In certain embodiments, a memory device can store instructions that when executed cause a processor to perform a method including performing an outer code (OC) codeword generation process. The method may include determining if there has been a prior write to a specific data storage location and, when there has not been a prior write to the specific data storage location, generating the OC codeword based on first data to be stored at the specific data storage location.

DETAILED DESCRIPTION

Figure 1:
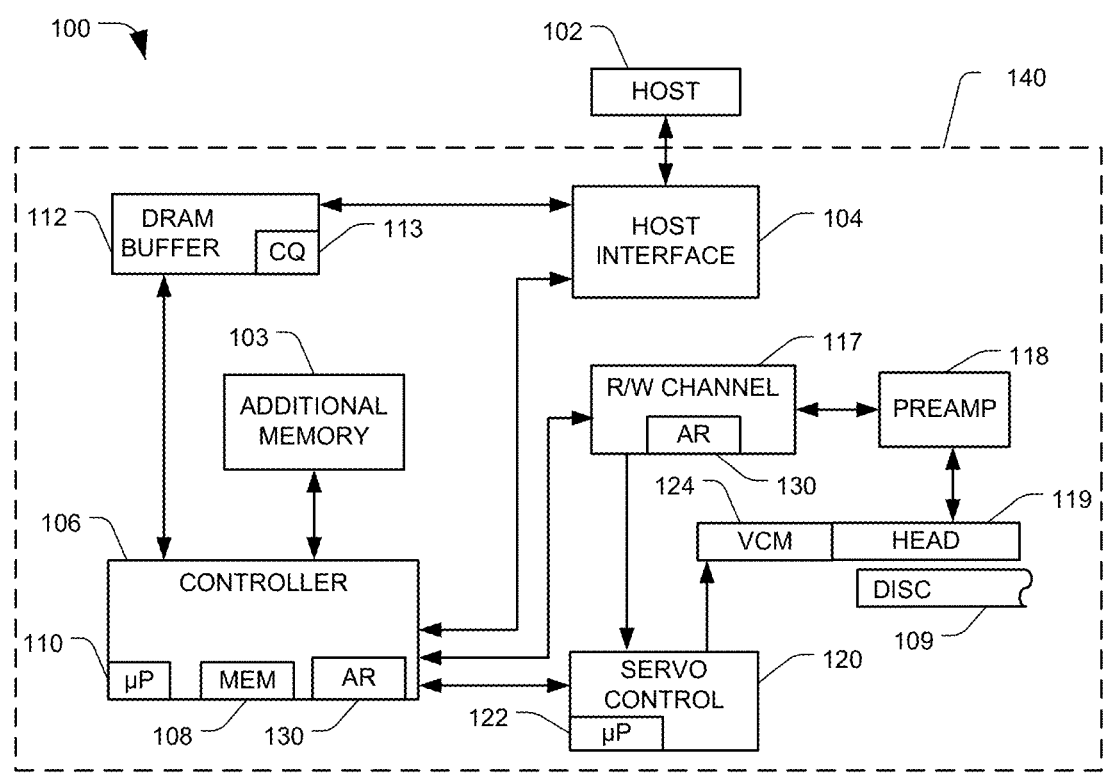
FIG. 1 is a diagram of a data storage device configured to implement a data segment with additional redundancy bits, in accordance with certain embodiments of the present disclosure.

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits (ASIC), programmable logic arrays, system-on-chip (SoC), and other hardware devices can likewise be constructed to implement the circuits, functions, processes, and methods described herein. Methods and functions may be performed by modules or engines, both of which may include one or more physical components of a computing device (e.g., logic, circuits, processors, controllers, etc.) configured to perform a particular task or job, or may include instructions that, when executed, can cause a processor or control system to perform a particular task or job, or may be any combination thereof. Further, the methods described herein may be implemented as a computer readable storage medium or memory device including instructions that, when executed, cause a processor to perform the methods.

Over 40 years of innovation in the hard-disc drive (HDD) industry has enabled reliable storage at areal densities surpassing 1 Terabit (Tb) per square inch. The average capacity of an HDD has just exceeded 5 TB and, with the introduction of advanced recording technologies such as Heat Assisted Magnetic Recording (HAMR), this trend is not slowing down. A significant problem that is arising with this growth in drive capacity is in the time it takes to manufacture a HDD. After assembly of its constituent parts, a HDD can go through a factory test-process to prepare it for use, which can involve functions such as writing servo to the disc(s), scanning the disc(s) for defects, selecting the areal density of each zone, optimizing the data channel, calibrating various parameters of the drive, or any combination thereof. On modern drives, these processes can be projected to take several months to complete, such as for the mass capacity drives that are growing in importance for data center applications.

The most time-consuming aspects of the manufacturing test-process include all operations that must be conducted for every track in a HDD. Of such processes, the operation of a flawscan, in which every sector in the HDD is written and subsequently read to locate defective portions of the media, may be the most time consuming, for example, comprising over 30% of the total test-time. Although an expensive procedure to conduct, a flawscan operation is a critical component to the production of reliable HDDs.

Since the write portion of the flawscan operation also serves to provide a factory format of the HDD, its operation is preferable. With this in mind, systems and methods are proposed herein to reduce the time of the read portion of the flawscan operation. Generally, we propose systems and methods that make use of a multi-sector based error correction technique (e.g., outer code error correction), which can allow the read portion of the flawscan operation to be performed for a subset of a HDD's tracks without compromising the reliability of the manufactured HDD. The proposed systems and methods provide a substantial reduction in manufacturing test-time while avoiding many of the shortcomings associated with unscanned tracks.

When a subset of the tracks (or all of the tracks) are left unscanned during the manufacturing test process there are two other possibilities as to how they can be handled in the field. In one embodiment, the unscanned tracks can be treated no differently than scanned tracks in normal operation in that they are written without regard to their status as unscanned tracks. Because these tracks have not been scanned for defects, there is always a chance that these tracks contain defects and, thus, the reliability of the manufactured HDD is compromised by this selection. In the other embodiment, tracks that are not scanned during manufacturing can be scanned in the field, either during drive idle time or between host commands. This assuages the reliability concerns associated with the previous approach, however, it comes with significant performance implications. Since the HDD write process is physical in nature (a write operation from the host includes the data to be stored along with the location to which it must be written), it is unavoidable that write requests will be made for unscanned tracks, which will require a read-before-write operation to ensure the targeted track is free of defects. Although the performance impact can lessen over time as more tracks are scanned, the write throughput reduction associated with this operation may not be acceptable. Additionally, it may take an extremely long time for the throughput loss to resolve itself as many of today's applications have little to no idle time to progress through an in-field scan of tracks. As a result, neither of these solutions alone are well-suited for modern HDDs.

Referring to FIG. 1, a system 100 is shown having a data storage device 140 configured to implement additional redundancy, in accordance with certain embodiments of the present disclosure. Specifically, FIG. 1 provides a functional block diagram of an example data storage device (DSD) 140, such as an HDD. The DSD 140 can communicate with a host device 102 (such as a server or personal computing device) via a hardware or firmware-based interface circuit 104. The interface 104 may comprise any interface that allows communication between a host 102 and a DSD 140, either wired or wireless. The interface 104 may include a connector (not shown) that allows the DSD 140 to be physically removed from the host 102. In some embodiments, the DSD 140 may have a casing housing the components of the DSD 140, or the components of the DSD 140 may be attached to the housing, or any combination thereof.

The buffer memory 112 can temporarily store data during read and write operations, and can include a command queue (CQ) 113 where multiple pending operations can be temporarily stored pending execution. Commands arriving over the interface 104 may be received in the CQ 113 or may be stored there by controller 106, interface 104, or another component. There may also be additional memory 103, which, for example, can be a volatile or nonvolatile solid state memory.

The DSD 100 can include a programmable controller 106, which can include associated memory 108 and processor 110. The DSD 140 can include a read-write (R/W) data channel 117, which can encode data during write operations and reconstruct user (or host) data retrieved from a memory, such as disc(s) 109, during read operations. A preamplifier circuit (preamp) 118 can apply write currents to the head(s) 119 and provide pre-amplification of read-back signals. A servo control circuit 120 may use servo data to provide the appropriate current to the coil 124, sometimes called a voice coil motor (VCM), to position the head(s) 119 over a desired area of the disc(s) 109. The controller 106 can communicate with a processor 122 to move the head(s) 119 to the desired locations on the disc(s) 109 during execution of various pending commands, such as read or write commands in the command queue 113.

Figure 7:
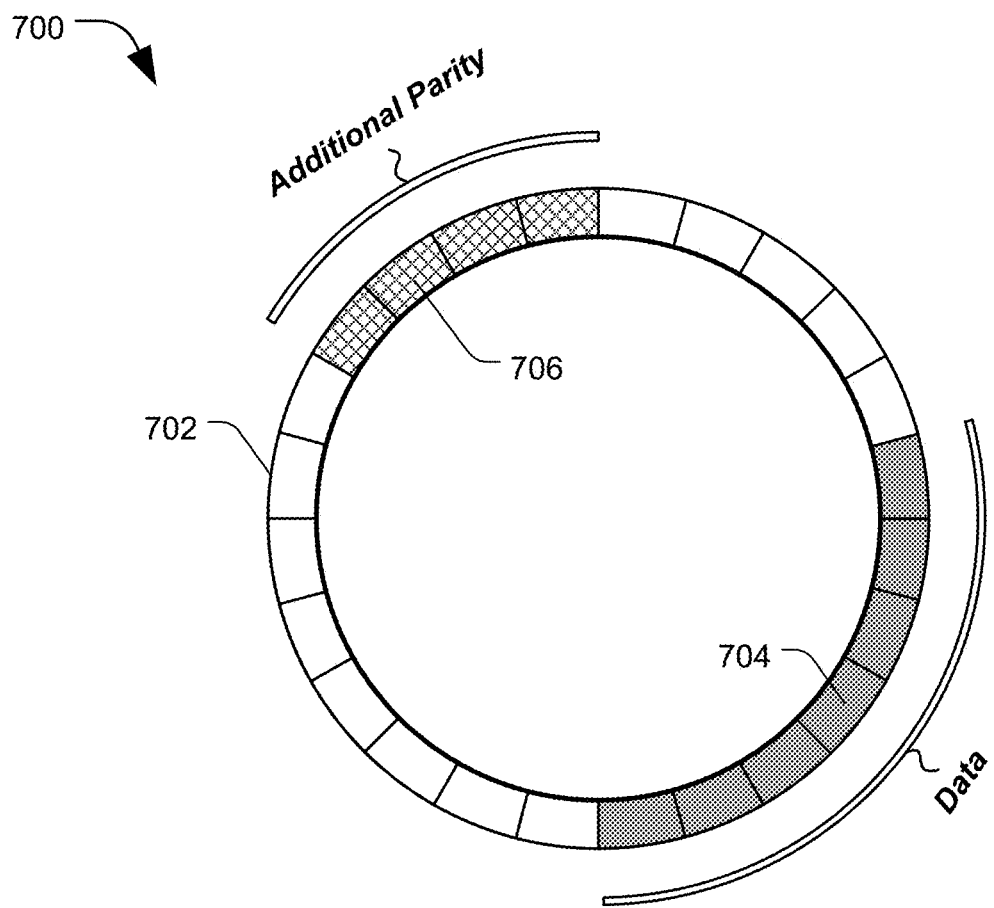
FIG. 7 is a diagram of an example disc data storage track storing a data segment with additional redundancy bits, in accordance with certain embodiments of the present disclosure.
Figure 9:
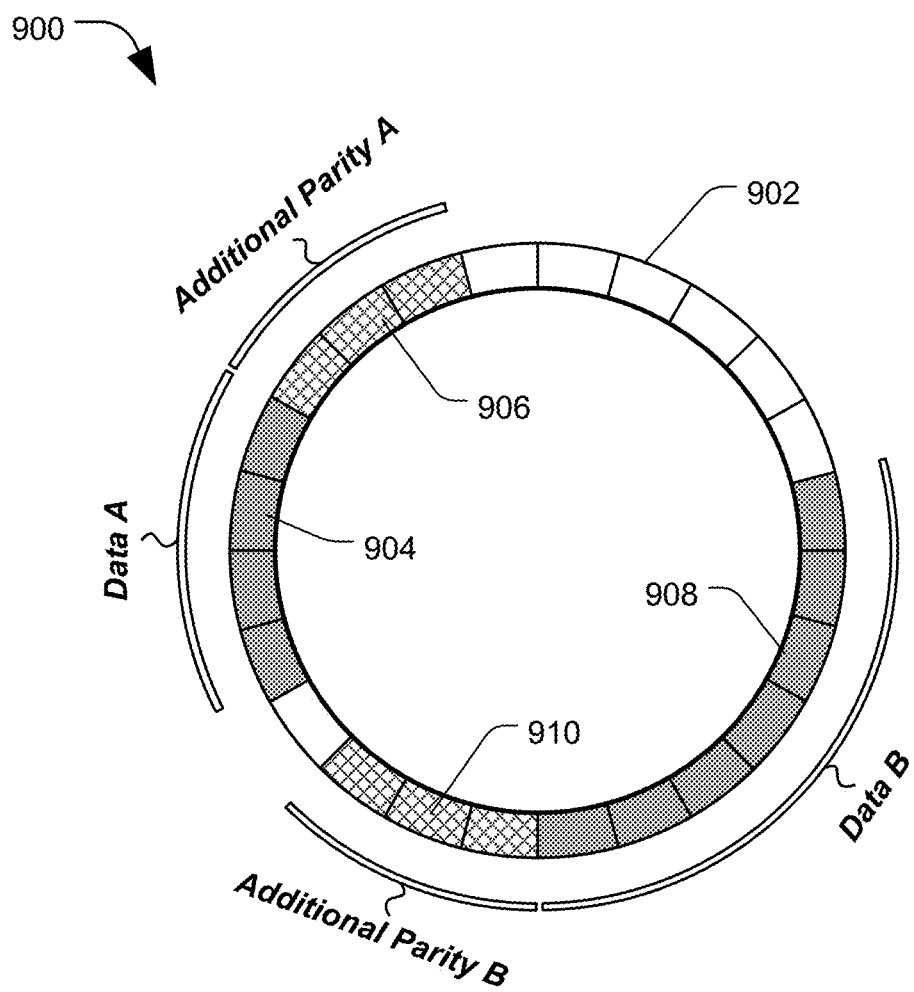
FIG. 9 is a diagram of an example disc data storage track storing multiple data segments with additional redundancy bits, in accordance with certain embodiments of the present disclosure.

During operation, the head(s) 119 of DSD 140 may be used to write data to and read data from disc(s) 109. The head(s) 119 may include both a write head element and a read head element. The write head can produce a magnetic field to write a signal to the disc 109 to facilitate storing data thereon. As the disc(s) 109 spin, the write head can store data in narrow concentric data tracks on the disc(s) 109, such as shown in FIGS. 7 and 9. The read head can read data from the disc(s) by generating a signal based on detected magnetic transitions stored to the disc(s) 109. The data channel 117 can estimate data based on the signal, which estimate may include one or more errors. Thus, the data channel 117 (or the controller 106) can include one or more modules to perform error detection and correction. When a data write operation is received or initiated, such as by the host 102 or the controller 106, the data channel 117 can generate inner code parity data and outer code parity data based on the data sectors to be written, such as described in FIG. 2.

In addition, DSD 140 may include an additional redundancy module (AR) 130. The AR 130 may operate to perform the redundancy methods and processes described herein. For example, the AR 130 may generate a third parity code in addition to the inner code parity data and outer code parity data. The AR 130 may be a logic circuit, processor, controller, discrete electronics, other circuit, a set of software instructions that when executed by a processing device perform the functions of the AR 130, or any combination thereof. In some embodiments, the AR 130 may be part of or executed by controller 106, part of or executed by data channel circuit(s) 117, part of or performed by other components of the DSD 140, or any combination thereof. In some embodiments, the AR 130 may be firmware stored in a memory, such as memory 108, that can be executed by the processor 110 to perform the redundancy processes described herein.

When an error is detected during the read process, the DSD 140 may, such as via the data channel 117, perform error detection and correction techniques to attempt to recover the data bits that correspond to the error(s). Examples of such techniques are provided herein. The error correction techniques may include using parity codes (e.g., bits providing redundancy information) to detect or process an error via an inner code decoding, an iterative inner code decoding, an outer code coding, an iterative outer code decoding, or any combination thereof, such as iterating between an inner code decoding and an outer code decoding.

Figure 2:
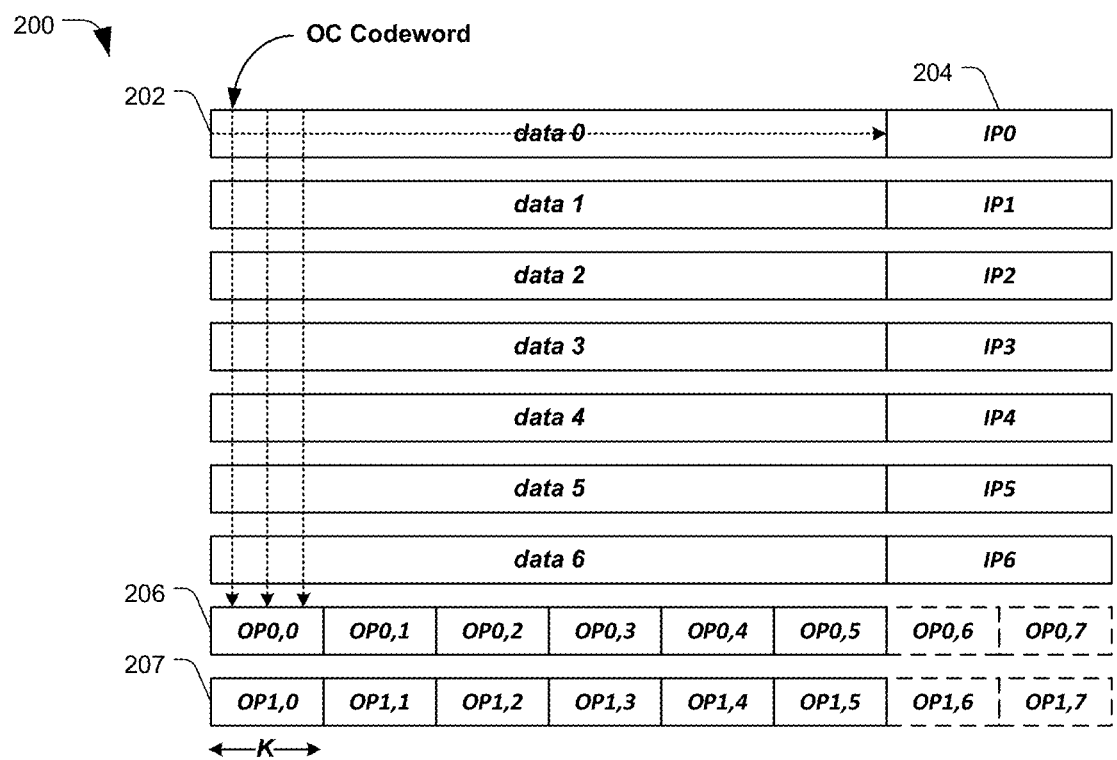
FIG. 2 is a diagram of a system with additional redundancy bits for a data storage device, in accordance with certain embodiments of the present disclosure.

Referring to FIG. 2, a diagram of a system 200 with additional redundancy bits for a data storage device is shown, in accordance with certain embodiments of the present disclosure. The system 200 can be utilized with DSD 100 to correct errors that occur during transmission of the data. An unavoidable fact of all communication systems is that the received data cannot be estimated without error, thus fostering the use of Error Correction Codes (ECC) to facilitate reliable data systems.

Thus, system 200 provides an example solution, in which a data sequence (data n) is encoded into redundancy bits (IPn) 204 (which may also be referred to as redundant parity bits or inner parity bits or Inner Code (IC)) to be stored along with the data as a sector on a track. This added redundancy can be exploited by the decoding process to correct observed errors and, in best case scenarios, reliably reproduce the stored data sequence. In some instances, such as when an unusually large number of errors are encountered, the decoding operation may be unable to recover the original data using the inner parity 204 but may still be able to be recovered using additional error recovery techniques.

Further, system 200 can include one or more Outer Code (OC) parity sectors (e.g., sectors 206 or 207) in which a subset of bits from all of the IC codewords (data n 202) are encoded into Outer Code parity symbols OP0,j and OP1,j. In some embodiments Outer Code parity does not cover the Inner Code parity bits, as indicated in the example 200 by the dashed lines around OP0, 6; OP0,7; OP1,6; and OP1;7.

One approach at mitigating data sector recovery failures is the use of the OC as an additional ECC to the IC. In the example 200 shown in FIG. 2, there are seven (7) sectors of data (data n) 202 depicted along with their associated IC parity (IPn) 204. Additionally, groups of K consecutive bits from each of these data sectors can be encoded into two groups of K OC parity bits 206 and 207 (e.g., OP0,0; OP1,0). In FIG. 2, the dashed OC parity symbols indicate that, in some embodiments, an improved format efficiency can be obtained with minimal performance loss by not generating OC parity bits for the IC parity bits. The seven data sectors 202 and their associated IC redundancy bits 204 can be stored along with two OC redundancy parity sectors 206 and 207 such that they can be used to aid a data recovery procedure in the event of an IC decoding failure. The OC recovery process can include erasure decoding, iterative decoding, or any combination or variation thereof.

Erasure decoding can perform error correction in which the location of errant data is known to the decoder. For example, if IC decoding fails to succeed for data sectors 0 and 2, it is known a-priori that the first K bits and the third K bits in each OC codeword are errant. If the amount of utilized parity in the OC is sufficient to correct these errors, then erasure decoding of the OC will be successful without error (irrespective of the quality of the sectors in error). In some cases, the number of sector failures tolerated by erasure decoding may be as large as the number of OC parity sectors utilized.

Iterative decoding can take failed data sectors (e.g., sectors that failed to be decoded merely via IC decoding) as an input (generally these would be digitized samples of these sectors) and iterate between the IC decoder and the OC decoder. As each decoding operation ensues, each decoder can pass its generated information to the other decoder. Through this process, each decoding operation works to facilitate the success of the other decoding operation. This can result in a decoding operation that is much more powerful than erasure decoding or IC decoding alone.

The use of an OC provides appreciable improvements in areal density in that, for an appropriately selected number of OC parity sectors, the resulting error correction allows for the areal density to be increased by an amount greater than the disk format required to store those parity sectors.

However, OC parity must be valid to use it in the decoding operation. For example, if a host writes a new data pattern data 3' onto the media location to which data 3 was stored, it acts to invalidate the two OC parity sectors associated with data 3. In this case, achieving valid OC parity may be accomplished by reading the other sectors (e.g., data 0, data 1, data 2, data 4, data 5, and data 6) and computing the parity along with data 3', or by reading the two parity sectors, removing the contribution of data 3, and adding the contribution of data 3'. In both cases, the two parity sectors would need to be re-written. Such operations can be expensive to carry out and, thus, the Outer Code parity sectors are generally stored in the same track as the sectors they are computed from to facilitate this operation.

When utilizing an augmented OC redundancy system, a manufacturer can implement a substantial reduction in manufacturing test-time by exploiting the error correction capabilities of OC. First, a manufacturer can implement a reduced cost (e.g., less time intensive) in-factory Flawscan procedure, which can act to scan only a subset (less than all) of the total tracks with the intention of locating large media defects. In doing so, only smaller defects may remain on the disc at the completion of the flawscan test-process. In the subsequent, in-field, drive usage, data can be written to the disk to both scanned and unscanned tracks, without delay, where data integrity is ensured by the protection afforded by augmented Outer Code redundancy.

Figure 3:
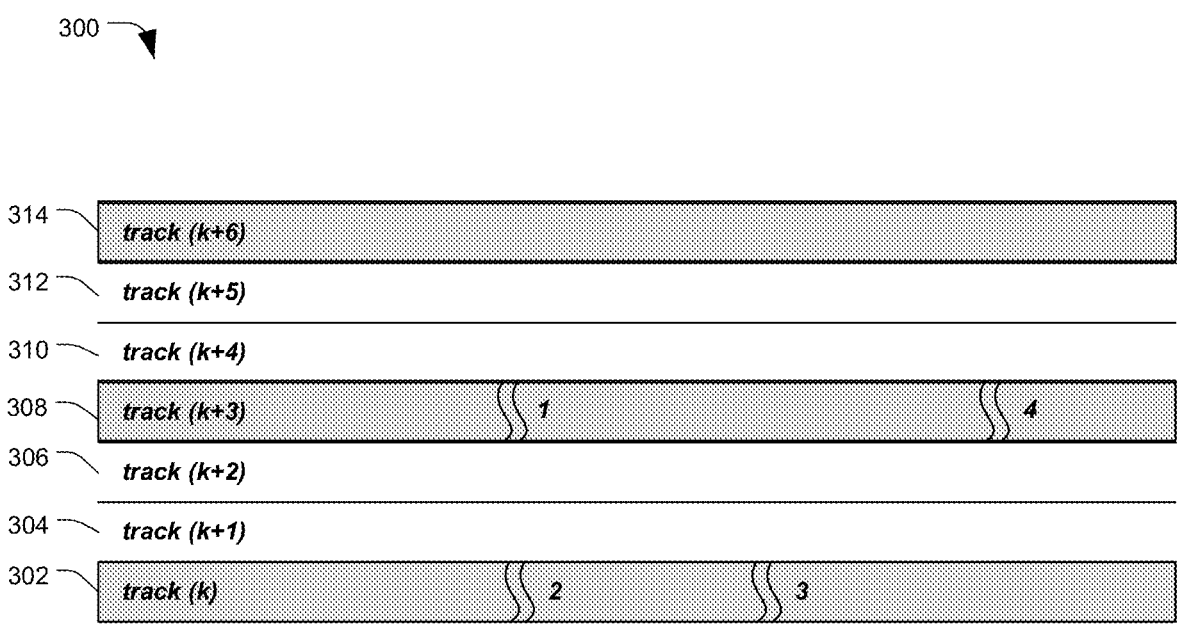
FIG. 3 is a diagram of disc data storage tracks showing defect locations, in accordance with certain embodiments of the present disclosure.

Referring to FIG. 3, a diagram of disc data storage tracks 300 showing defect locations is shown, in accordance with certain embodiments of the present disclosure. The tracks 300 are an example representation of data tracks on a disc data storage medium, such as disc 109. The tracks 300 are the result of an example in-factory flawscan operation where, rather than scanning every track the process can scan less than all of the tracks, such as tracks 302, 308, and 314 that are scanned, and tracks 304, 306, 310, and 312 that are not scanned. In this example, a flawscan procedure may finds four defects (labeled 1, 2, 3, 4).

Figure 4:
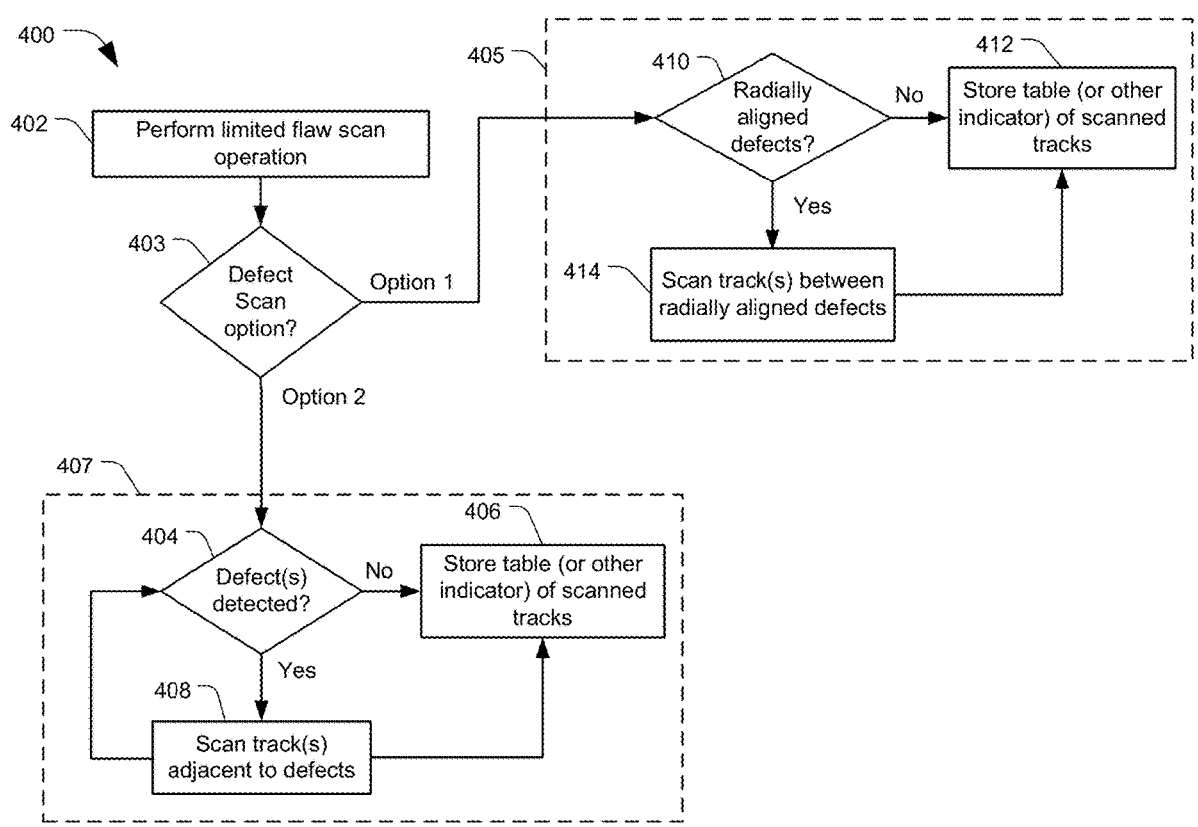
FIG. 4 is a flowchart of a flawscan process, in accordance with certain embodiments of the present disclosure.

FIG. 4 provides an example flawscan process 400. A limited flawscan operation can be performed, at 402, which may result in the track defects shown in FIG. 3. When defects are detected during the flawscan of the subset of tracks, various other flawscan augmentation operations may occur. For example, additional tracks can be scanned according to the defects located on the scanned tracks. Either of the following criteria examples may be used for this depending on the defect statistics for the media under consideration. In some instances, a process may determine, at 403, whether to implement a first additional track scanning process 405 or a second additional track scanning process 407. In some embodiments, only one of the two additional track scanning processes may be implemented; however; in other embodiments, both or a combination of the track scanning processes may be implemented.

In the first additional track scanning process 405, if two defects are radially aligned (within some margin of error), at 410, then the tracks between these tracks can also be scanned, at 414. In the example shown in FIG. 3, the radial alignment of defects 1 and 2 might trigger tracks (k+1) 304 and (k+2) 306 to also be scanned. This criterion can be used to locate defects that are observed on scanned tracks but also span unscanned tracks. When there are no radially aligned defects, at 410, or the tracks between the radially aligned defects have been scanned, at 414, the process 405 may store an indicator of which tracks were scanned, such as one or more bits in a look-up-table (LUT) or one or more bits stored within each corresponding track.

In the second additional track scanning process 407, if a defect is found on any track, at 404, both adjacent tracks can also be scanned, at 408. In the example shown in FIG. 3, defects found in tracks (k) 302 and (k+3) 308 might trigger tracks (k−1) (not shown), (k+1) 304, (k+2) 306, and (k+4) 310 to be scanned. This criterion could also be further utilized on the newly scanned tracks, such that, if a defect was found on track (k+4) 310, it could also trigger a scan of track (k+5) 312. This criterion can be used to locate defects observed on scanned tracks that may also encroach into unscanned tracks. When there are no adjacent aligned defects, at 404, or the tracks adjacent the defects have been scanned, at 408, the process 407 may store an indicator of which tracks were scanned, such as one or more bits in a LUT or one or more bits stored within each corresponding track. If a defect is found on a track adjacent to a scanned track, at 408, another track adjacent to the previous adjacent track can be scanned for a defect, and so on. Variations of this defect scan option may include a limit to the number of adjacent tracks that are scanned or there may be no limit to the number of adjacent tracks that are scanned.

The second additional track scanning process's 407 criterion is a much stricter criterion than the first track scanning process's 405 criterion because it can result in more tracks being scanned. In general, however, an average factory flawscan locates defects on a very small amount (approximately 0.1%) of the tracks scanned. Thus, the total tracks scanned between the two additional scanning processes 405 and 407 would increase only a small amount using the second scanning process's 407 criterion, and would not likely appreciably affect the flawscan time for small defect rates. If, however, the defect rate was found to be larger, use of the first example's criterion could be useful in keeping excess reads as low as possible during the flawscan process.

These processes can allow a DSD manufacturer to catch large defects that may affect unscanned tracks through observations of scanned tracks while limiting the overall time spent in a factory flawscan process. In some embodiments, a DSD manufacturer may implement either augmenting scanning process 405 or augmenting scanning process 407, or, in other embodiments, may implement both augmenting scanning processes 405 and 407. Further, other variations of scanning processes may be utilized by the flawscan process or by the manufacturer in conjunction with the additional redundancy data systems and processes described herein.

Note that tracks are really just arbitrary paths around the disc, as defined by the written servo pattern. Although it may be possible for a large defect to follow an unscanned track, or a band of unscanned tracks, for some portion of a revolution, the probability of such a defect going undetected depends on how thorough the employed flawscan process is. By using the proposed flawscan procedures implemented appropriately based on the defect statistics of the utilized media, the implemented scanned track spacing should sufficiently limit the probability of an undetected defect of appreciable size. Together with the implemented scan augmentation criteria, the overall process should result in only sufficiently small defects remaining on the surface following the in-factory flawscan. Such remaining small defects can be handled as detailed in the following discussion.

Figure 5:
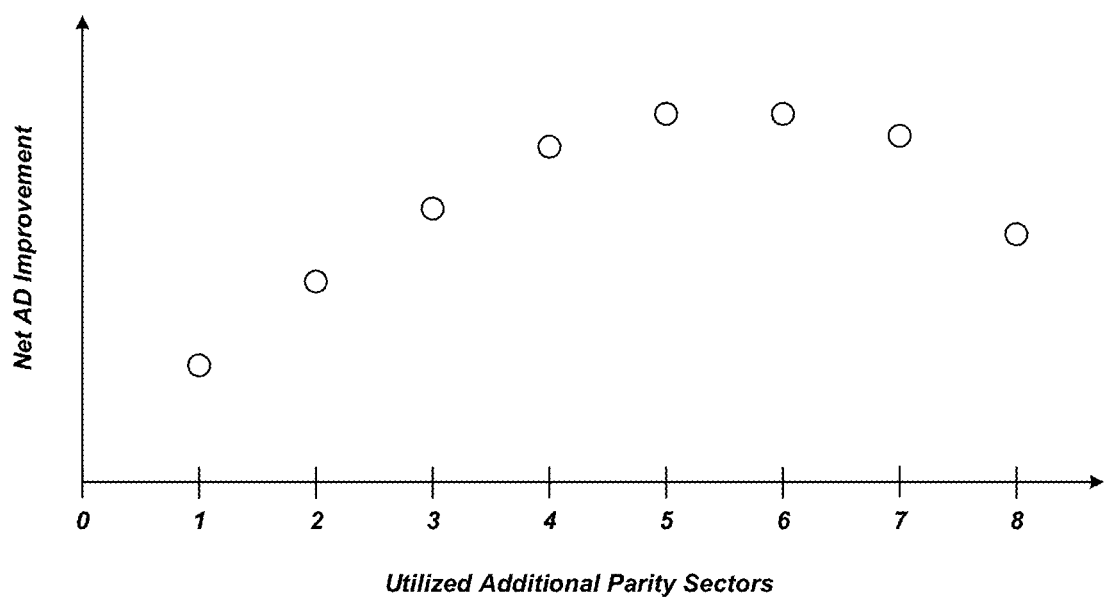
FIG. 5 is a chart showing net aerial density (AD) improvement versus utilized additional redundancy sectors, in accordance with certain embodiments of the present disclosure.

Referring to FIG. 5, the chart shows net aerial density (AD) improvement versus utilized additional redundancy sectors, in accordance with certain embodiments of the present disclosure. As discussed above, the use of OC is extremely effective at recovering sectors that are unable to be recovered using an IC. Use of an OC, however, is not free in that drive capacity is consumed storing the generated parity sectors (for both IC and OC). As a result, the additional error correction capability afforded by the OC is, generally, first translated into an increased areal density (e.g., bits or tracks are written closer together). The format required to store the OC parity sectors is, then, subtracted from this areal density increase to give the Net Areal Density (AD) Improvement, which often looks as illustrated in FIG. 5. In the example shown, adding up to five OC parity sectors (horizontal axis) continues to provide areal density benefits, after which it flattens off for six OC parity sectors, and begins to drop thereafter.

In some uses of an Outer Code, the number of utilized parity sectors can be selected to maximize the achievable Net AD Improvement. For the example given in FIG. 5, this would mean either five or six additional OC parity sectors might be used. However, in other embodiments, we can use as many OC parity sectors as possible without too significantly impacting the achievable AD. In the charted example, using seven parity sectors would give a slightly lower AD than using five or six, however, it may be advantageous to accept this (small) loss in Net AD Improvement to improve robustness to defects. Thus, selection of the number additional OC redundancy sectors can be selected based on the goals of the implemented system for AD and defect robustness.

At the completion of the in-factory flawscan write operation, valid OC parity can be written to their stored locations. As a result, all factory written sectors are protected by OC parity sectors, however, any in-band write operation to a factory written track would invalidate the written OC parity sectors and, thus, eliminate the protection they afford. In the following discussion, we detail the possible in-field operations to maintain OC protection for sectors written to unscanned tracks and, in some applications, the in-field scan process to allow for in-band writes to these tracks without concern for written data integrity.

Augmented Parity Redundancy

Functionally, the main facet that distinguishes a shingled magnetic recording (SMR) configuration of tracks on a disc from a non-shingled magnetic recording (CMR) configuration of tracks on a disc is an imposed ordering of write operations. In SMR configurations, collections of adjacent tracks (e.g., tracks (kS), (kS+1), . . . , (kS+S−1)) can be grouped into shingles and, within a shingle, the tracks must be written in a specific order because the tracks overlap on at least one side with another track in the shingle. In the example, for an increasing track order, this means that track (kS+i) should be completely written before the write of track (kS+i+1) can begin and, once the write of track (kS+i+1) begins, no sector in tracks (kS), (kS+1), . . . (kS+i) may be rewritten without restarting the write of that shingle. This is not to say that an entire shingle must be written before the write of another shingle is started. There can be (potentially) thousands of open shingles that are in various stages of being written at any given time.

The imposed ordering of SMR write operations is extremely important to maintaining valid OC parity. For each open shingle, only a single track is typically in the process of being written and, as such, an OC parity can be maintained for the sectors thus far written to the track. As a track nears completion, the final user data sector can be written followed by all the OC parity sectors, after which the parity is reset for use on the next track. Note that, once the write of a following track begins, the previous track cannot be written in-band and, therefore, the written OC parity sectors remain valid for the lifetime of that specific write of the shingle. All sectors stored in shingles on an SMR drive, therefore, have valid OC parity to protect them, which can be written in all completed tracks or stored in memory (on-chip SRAM or external DRAM or on the tracks themselves) for partially written tracks.

Ideally, the protection afforded by the OC can be sufficient to overcome any defects that remain on unscanned tracks. If a number (Np) of parity sectors are utilized, erasure decoding can recover (as many as) Np sector failures without error, which may be irrespective of how badly damaged the sectors are, and potentially many more can be recovered using iterative decoding. While there is a possibility that disks may be manufactured with exceptionally large defects that can corrupt many more sectors than OC decoding is capable of recovering, the previous detailed augmented flawscan processes should be able to avoid the complications which arise from such scenarios. Although massive defects can arise, by scanning a subset of all tracks on a disc and employing an additional criterion (or criteria) for expanding the scan to additional tracks, it is highly unlikely for large defects to go unnoticed via the in-factory flawscan process. Through appropriate implementation of an augmented scan flawscan process, the probability of such an occurrence may be kept below an acceptable unrecoverable error-rate specification.

As detailed below, by utilizing an augmented redundancy system, a disc drive can write data into both scanned and unscanned tracks without concern for data integrity of the original data on the respective tracks. In some embodiments, no explicit additional scan is conducted of the tracks not scanned during manufacturing. In a hard disc drive, every read operation may be considered a scan in that, if a data sector is deemed to be of low quality during a read operation, it could be added to a grown defect list to avoid using that data sector for subsequent data storage. In the embodiments discussed herein, such use of scan operations can be combined with the processes disclosed.

The lack of an explicit scan operation for some tracks may lead to a reduction in margin relative to tracks that were explicitly scanned. For example, if nine parity sectors are utilized for each track and a given track contains a defect impacting three sectors, the remaining erasure decoding margin is only six sectors, whereas a scanned track could, ostensibly, have a nine sector erasure decoding margin. Although we consider the data integrity secure even with this reduced margin, an explicit scan of this track could be used to identify these sectors as defective. In doing so, the DSD may be able to reclaim this lost margin during the lifetime of the DSD by adding them to the drive's grown defect list so as to avoid their use for future data storage operations.

Figure 6:
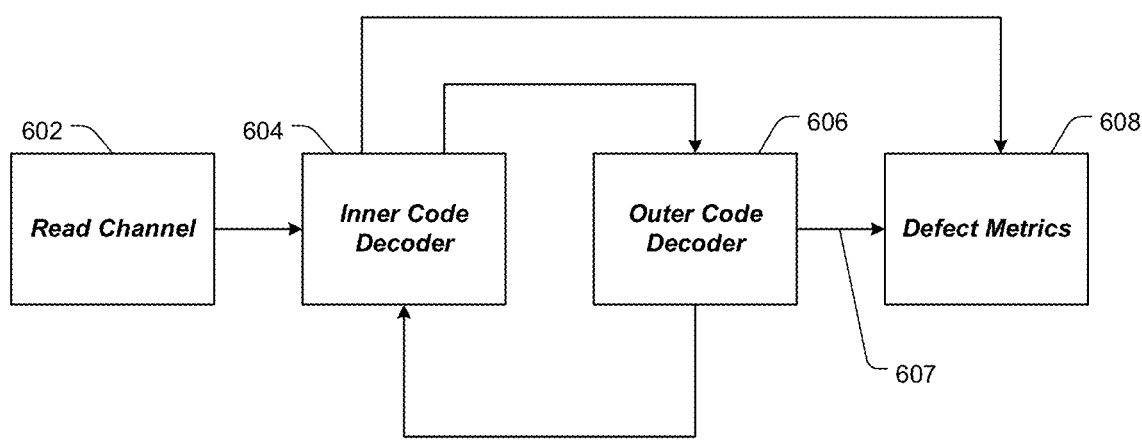
FIG. 6 is a diagram of an iterative decoding system using inner decoding and outer decoding, in accordance with certain embodiments of the present disclosure.

During an in-factory flawscan process, a known data pattern can be written to the tracks of the disc to facilitate utilization of OC redundancy in the field. When the drive is used in the field, however, the track may be storing user data (e.g., data written after manufacturer shipping the DSD) and, therefore, the data channel 602, such as data channel 117, may not know the user data prior to reading it. In some cases, the IC decoding operation may be successful and, as shown in FIG. 6, the written data pattern can be passed to the defect metrics block 608 to determine the quality of the media. In circumstances in which the IC decoding operation 604 is not successful, the OC decoding operation 606 may be able to generate this written data sequence 607, which would be otherwise unavailable. Without the availability of OC decoding, the written data sequence may remain unknown and, therefore, there may be no straightforward method of understanding if the media is defective. Simply mapping out any sector which cannot be recovered with IC decoding is a potential option, however, it could be wasteful as it could map out more than just defective media.

A disc drive that does not have all of its tracks scanned during manufacture may need to scan all unscanned tracks in the field (e.g., while the drive is in use or when a user initializes the drive). The process of scanning tracks not scanned during manufacturing can be handled in a number of different ways. In one simple form, a scan of all unscanned tracks can be performed by selecting an ordering for all unscanned tracks and implementing a counter to track the current position in the scan. Although such implementation is simple, it can be quite inefficient in its execution. Scanning tracks is typically done in the background (e.g., between host commands or other operations of the DSD); however, since current applications and operations utilized in a modern DSD tend to have very little idle time, the track scanning would likely need to be interleaved into host commands. Changing heads or moving the VCM 124 to a different radius just to scan a next track on the unscanned list is not efficient, particularly when there may be unscanned tracks adjacent to (or very close to) the last track written or read by the host. To assuage this, multiple counters may be employed by segmenting a drive into partitions and selecting the next track to be scanned from a partition that is most convenient. An example would be to segment each surface into three regions (e.g., inner-diameter, middle-diameter, and outer-diameter) such that three counters are employed for each surface so as to never require a head change or a VCM positional movement more than ⅓ of the radius of the disk. Since there are approximately one million tracks per disc surface, each employed counter would require less than twenty bits to implement, so storage of these counts is not appreciable. At its most complex form, a bit could be employed per track to indicate whether it has been scanned or not such that the closest unscanned track can be selected next for scanning. For example, in a 10-disc (20 total surfaces) HDD, approximately (20e6×(N−M)/N) bits would be required, where N is the total number of tracks, M is the number of scanned tracks, and (N−M)/N is the percentage of tracks in the drive not scanned during manufacturing. If, for example, half the tracks were scanned during manufacturing, 1.25 MB of storage would be required to implement such a scan system, which can be easily managed by the HDD.

Thus, if it desirable to utilize an in-field defect scan, it can be accomplished with negligible performance loss. The maintained OC parity validity systems and process (detailed below) allow for writing to unscanned tracks without concern for data integrity and, thus, host requests can be serviced without delay. As such, the scan operation can be accomplished over an elongated period of time by slowly interleaving them into host requests or during drive idle time (if there is any). This is particularly true since much of the built-in drive margin is to account for long term effects, such as reader degradation, that do not affect the start of a drive's life.

As previously explained, since all sectors written to an SMR shingle in an HDD have the protection of valid OC parity, data integrity can be maintained even though write operations are (potentially) conducted to tracks that have not been explicitly scanned for defects. However, the presence of defects on unscanned tracks can reduce their associated error correction margin since, in an OC decoding attempt, some of the OC correction power may be consumed with recovering sectors affected by unknown defective sectors in the corresponding unscanned track. Below are embodiments of additional redundancy that can be added if additional error correction margin is desired over that which is afforded by a default amount (e.g., a selected amount selected in manufacturing or product design) of OC parity sectors.

A process of generating OC redundancy data does not need to be specific to the desired number of utilized OC parity sectors. More OC parity sectors can be generated than will be stored on a track for use in OC decoding. The remaining (not stored on the track) OC parity sectors could be simply discarded, such as if there is no intention to store them. However, the additional OC parity sectors (those not stored on the track) could be used to improve the reliability of unscanned tracks. In some embodiments, the additional OC parity sectors could be stored outside of the normal format of the drive such that they can be retrieved, if required, during an in-field scan of a track or a data recovery operation prior to its scan. In some embodiments, the additional OC parity sectors could be written into a reserved area of the disc, such as a media cache, and in others they could be stored in other forms of available non-volatile memory (e.g., a NAND flash memory). To implement these embodiments, however, a significant amount of storage may be required. For example, if half the tracks in a drive are unscanned, additional OC parity sectors could need to be stored for approximately 500,000 tracks per disc surface, or ten million (10,000,000) tracks per 10-disc (20 surfaces) HDD. As such, if one additional 4 kB parity sector is stored per unscanned track, a total of 40 GB of storage mat be required, which is about 0.2% of the capacity of a 20 TB HDD. Although, the extra data storage needed for the additional OC redundancy sectors can be a large amount of data storage, such data storage should not be lost (utilized for additional OC parity data) for the life of the HDD because the additional OC parity sector(s) may be discarded for a track after it has been scanned in the field.

Although such approaches are manageable, reducing the amount of memory requirements to store this additional parity is highly desirable. To help with this issue, a system can incorporate an additional level of OC which spans multiple unscanned tracks. Returning to an example of an in-factory scan of half of the tracks in the drive, additional OC parity can span a number (T) of unscanned tracks (therefore, the additional OC parity is computed from all data sectors in the T tracks). Such embodiments are capable of reducing the storage requirements of the addition OC parity by a factor of T and, thus, can make the storage utilized significantly less. In addition, such embodiments have the added benefit of requiring more defects to affect its error correction capability. For example, consider the case in which tracks (k), (k+2), and (k+4) are scanned tracks, and the additional OC parity sectors spans unscanned tracks (k+1), (k+3), and (k+5). Since each of the unscanned tracks spanned by the additional OC parity data are physically separated by scanned tracks, a single defect should only affect one of these unscanned tracks. Thus, it would take multiple defects to affect multiple tracks and, therefore, the probability of such an occurrence is significantly lower than a defect in a single track. Further, the additional OC parity sectors can be stored outside the normal drive format (e.g., in a media cache or non-volatile solid state memory) and may be discarded after all of the unscanned tracks the additional OC parity sector(s) spans are scanned.

To reduce redundancy data storage requirements even below that required by an additional level of OC, such as the example spanning multiple unscanned tracks, a variable additional OC redundancy scheme can be employed. In some embodiments, rather than storing additional OC parity sectors for all unscanned tracks, or multiples thereof, added parity sectors may be stored only for a subset (less than all) of the unscanned tracks. Since the presence of defects on unscanned tracks may not be known, defects can be inferred from observations on scanned tracks. As discussed above, the existence of defects on scanned tracks can act to trigger scans of other tracks, such as adjacent tracks. In practice, however, defects can exist in a continuum of magnitudes and sizes and, although a track may be deemed as not containing a defect, the track's quality could be deemed close to the threshold selected for classifying it as defective (e.g., the track contains a "near defect"). In such circumstances, we may choose a lesser threshold which, when exceeded, requires that additional OC parity sectors to be stored for adjacent, unscanned, tracks. Using this approach, additional protection may be obtained only for tracks for which it is deemed necessary, thus significantly reducing the memory requirement, either on-disc or in other memory, for the additional OC parity storage.

While some of the discussion herein is about SMR implementations, the systems and processes for scanning and strong additional OC redundancy data are also applicable to CMR implementations. Although, CMR does not have the luxury of a specified ordering of write operations that allows for 100% OC parity validity. Instead, while the manufacturing written data during a drive format should be written with valid OC parity, any write to a track that is less than all of the track will invalidate that OC parity and, thus, eliminate the redundancy protection it affords. Some solutions to the problem of maintaining valid parity in CMR configurations include allowing OC parity to become invalid by in-track write operations and, during idle time, scanning whole tracks, re-generating their OC parity data, and storing the OC parity data for the corresponding track. However, such approaches may not work in this context as invalidating OC parity on an unscanned track can compromise the integrity of the written data due to the possibility of unknown errors and, therefore, such approaches are not viable solutions for ensuring data integrity.

One solution to handling this situation is, if a write request is made for a track that has not yet been scanned (either in the factory or in the field), the unscanned track must first be read before writing any new data to the track. This operation can be referred to as a read-before-write operation, which, in this context, can serve two distinct purposes. First, it serves to collect the data already written to the track that will not be overwritten by the impending write operation that, along with the newly written data, is used to generate newly updated OC track parity. This updated OC parity would, then, also be stored for the track. Secondly, the read operation can also serve to scan the track for defects. In some embodiments, in the event that an entire track is designated to be written with new data, the HDD could avoid the read-before-write operation and instead merely write the whole track, as this situation is identical to the SMR case. In such embodiments, we can avoid the performance degradation associated with the read-before-write operation, however, the read operation omission also means that the track remains unscanned even after the write operation is completed. In practice, however, we likely cannot rely on a preponderance of full-track write operations and, thus, implementing a read-before-write approach would incur a significant write throughput loss at the start of a HDD's usage life. Although this throughput loss will diminish as more tracks are scanned, in many applications this throughput loss, even if transient in nature, would not be tolerable.

To avoid the performance degradation caused by a read-before-write operation for unscanned tracks, a bit can be used to track the status of every sector not scanned during manufacturing. For example, on a disc with approximately 600 sectors per track, this would require less than 1 GB of storage and that amount of required storage can still be manageable. Such a scheme can be implemented in various embodiments for maintaining valid parity on writes without first requiring a read operation, such as discussed below.

Referring to FIG. 7, an example disc data storage track storing a data segment with additional redundancy bits is shown and generally designated 700, in accordance with certain embodiments of the present disclosure. The system 700 can be implemented by an HDD, such as HDD 140. In some embodiments, an HDD can perform a track's first in-field write operation, such as a write operation destined for the data sectors 704 (indicated by the gray shading) where the not written sectors (depicted without shading) will still contain the factory written data. Since the data written during manufacturing is known, valid OC parity sectors can be generated from the new data to be written and the known remaining factory written sectors without requiring a read operation (e.g., without reading other data from the specific data storage location). The write operation can then write the data sectors 704 to the track 702 followed by writing updated parity sectors 706 (shown with cross hatching), which may be done in a same revolution of the disc. Note that, although valid parity may be maintained for the first in-field write operation without a read operation to each unscanned track, subsequent write operations cannot use this approach to maintain OC parity data since the written data from the first in-field write operation would not, typically, be known when later write operations are conducted. As a result, the track may first need to be read in order to scan the track for defects. After only the first in-field write operation to the track, in the event of an IC decoding failure, every sector on the track should contain either known, factory-written, data or is protected with OC parity and, as such, should be recoverable. The read that can occur before subsequent in-field write operations can also serve to compute OC parity using the data from sectors that will still reside on the track following the subsequent write operation(s) combined with the new data to be written. The newly computed OC valid parity sectors can then be stored, such as written into their assigned location on the track. An example with further possible embodiment of this process is provided with respect to FIG. 8.

A second in-field write operation to an unscanned track can trigger a read-before-write operation. Thus, the use of this process allows for some delay before a read-before-write operation becomes necessary, providing some amount of time for additional in-field track scans to be performed, which reduces the in-field track scans impact on performance as they become necessary.

Figure 8:
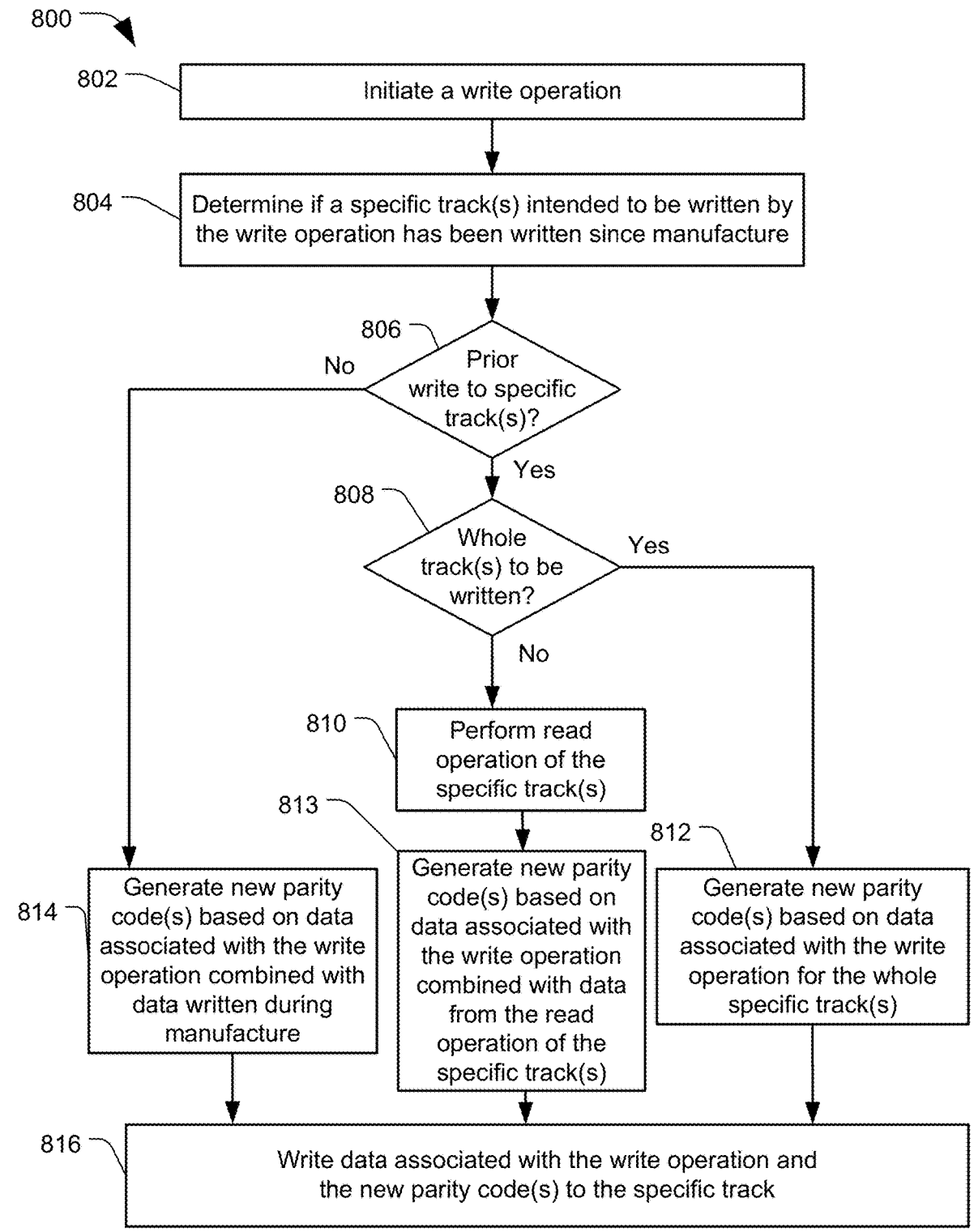
FIG. 8 is a flowchart of a method for writing additional redundancy bits in a data storage track, in accordance with certain embodiments of the present disclosure.

Referring to FIG. 8, a flowchart is provided of a method 800 for writing additional redundancy bits in a data storage track, in accordance with certain embodiments of the present disclosure. The method 800 may be implemented by, or with, the systems and processes described herein. The method 800 is an example implementation of the embodiments discussed with respect to FIG. 7.

The method 800 may start when a write operation is initiated, at 802, which, for example, can occur when a HDD, such as HDD 140, receives a write instruction from a host, such as host 102. The method 800 may then determine if a specific track(s) intended to be written by the write operation has been written since manufacture, at 804. When the track(s) intended to be written have not been written since manufacture, at 806, the method 800 may then generate new OC parity code(s) based on data associated with the write operation combined with data written during manufacture, at 814. When the new OC parity data is obtained, the data associated with the write operation and the new OC parity data can be written to the selected track, at 816.

The method 800 may also evaluate whether a whole track is to be written, at 808. In some embodiments, the whole track write evaluation, at 808, can be performed prior to the previous write evaluation, at 806. When a whole track is to be written, at 808, the method 800 may then generate new OC parity code(s) based on data associated with the write operation for the whole selected track, at 812. When the new OC parity data is obtained, the data associated with the write operation and the new OC parity data can be written to the selected track, at 816.

When a whole track is not to be written, at 808, and there has been a prior write to the selected track, at 806, the method 800 may then perform a read-before-write operation, at 810. The read-before-write operation can include reading all data associated with the selected track intended to be written to by the write command. The method 800 may then generate new OC parity code(s) based on the new data associated with the write operation combined with the old data obtained by the read-before-write, at 813. When the new OC parity data is obtained, the new data associated with the write operation can be written to the selected track, along with the new OC parity data, at 816. Further, in some embodiments, a read of old data from a track, such as in a read-before-write operation, can act as a defect scan for that track and, therefore, can subsequently be marked as a scanned track.

Referring to FIG. 9, an example disc data storage track storing a data segment with additional redundancy bits is shown and generally designated 900, in accordance with certain embodiments of the present disclosure. The system 900 can be implemented by an HDD, such as HDD 140. The data storage track 902 can include multiple data segments (shown with shading), such as data A 904 and data B 908, and multiple additional OC parity segments (shown with cross hatching), such as parity segment A 906 and parity segment B 910.

In some embodiments, for each write operation conducted on an unscanned track, additional OC parity data can be computed and written immediately following the write operation's associated data sectors. Track 902 depicts two write operations where the groups of data sectors are indicated as Data A 904 and Data B 908 and their associated parity sectors by OC Parity A 906 and OC Parity B 910. This approach can support multiple write operations to a single track without requiring a read-before-write operation. Write operations can continue without delay until an intended write operation overlaps with a previous write operation (either in the data or parity regions), a point at which the track 902 must first be scanned for defects prior to writing the data to the track.

Since this approach can change the location of OC parity sectors written before and after a track is scanned, the location of which tracks have been unscanned and subsequently written can be tracked by firmware, such as with a single bit per track. For example, if a track written with data, such as track 902, is scanned and found to be free of defects, it needs not be immediately re-written with parity sectors in their nominal location. Instead, the track can be tracked as being in a nominal OC location format and can be rewritten with the track's nominal format (e.g., the format implemented in manufacturing) when it is convenient to do so.

Embodiments with these implementations can allow for the scan of additional tracks before a read-before-write operation is required and, thus, such a system can further alleviate the performance degradation read-before-write operations can cause. An example with further possible embodiment of this process is provided with respect to FIG. 10.

Figure 10:
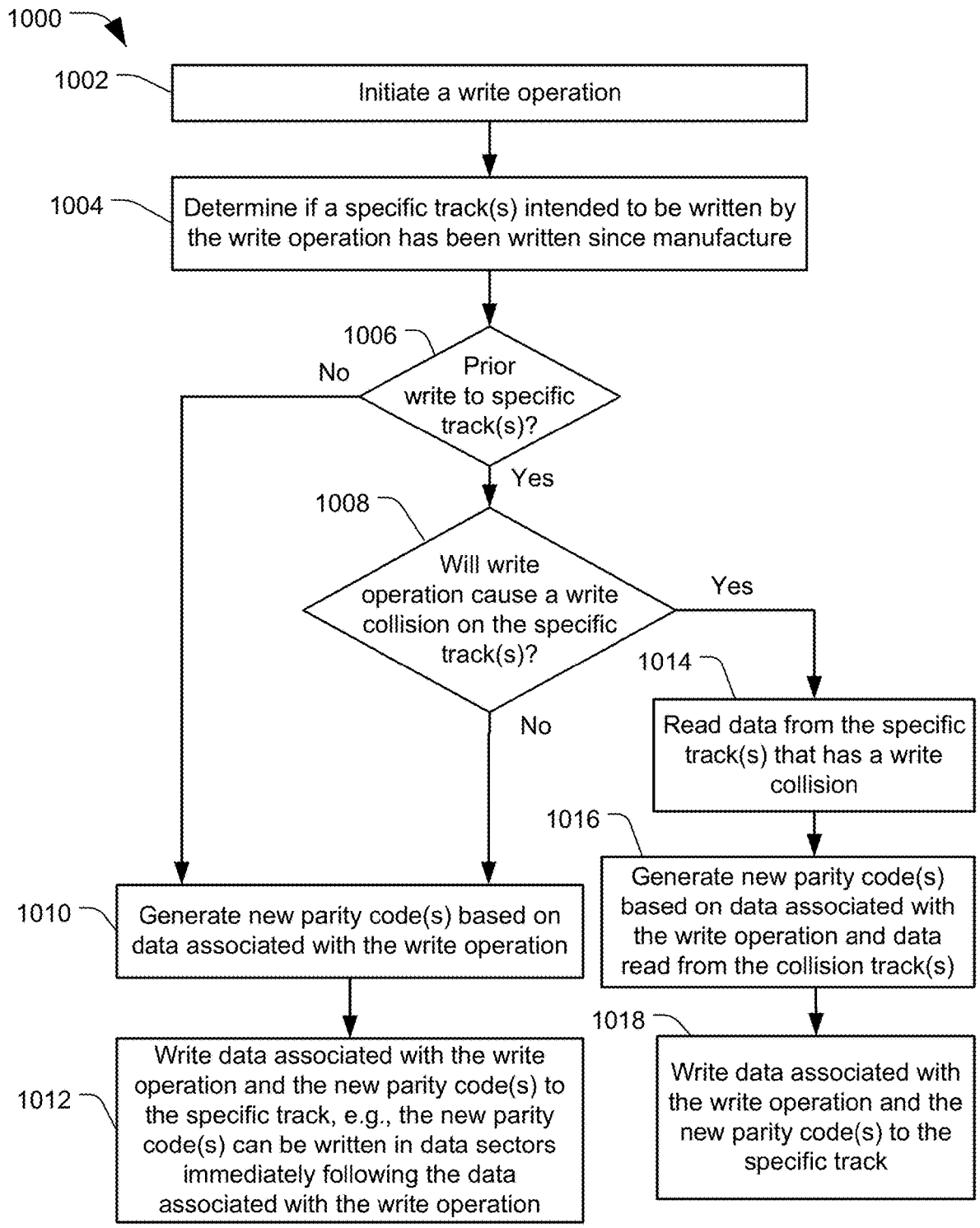
FIG. 10 is a flowchart of a method for writing additional redundancy bits in a data storage track, in accordance with certain embodiments of the present disclosure.

Referring to FIG. 10, a flowchart is provided of a method 1000 for writing additional redundancy bits in a data storage track, in accordance with certain embodiments of the present disclosure. The method 1000 may be implemented by, or with, the systems and processes described herein. The method 1000 is an example implementation of the embodiments discussed with respect to FIG. 9.

The method 1000 may start when a write operation is initiated, at 1002, which, for example, can occur when a HDD, such as HDD 140, receives a write instruction from a host, such as host 102. The method 1000 may then determine if a specific track(s) intended to be written by the write operation has been written since manufacture, at 1004. When the track(s) intended to be written have not been written since manufacture, at 1006, the method 1000 may then generate new OC parity code(s) based on data associated with the write operation, at 1010. When the new OC parity data is obtained, the data associated with the write operation and the new OC parity data can be written to the specific track such that the new OC parity code(s) are written in data sectors immediately following the data from the host associated with the write operation, at 1012.

The method 1000 may also evaluate whether a specific write operation (e.g., including host data and an amount of new parity data) will cause a write collision on the specific track(s), at 1008. When the specific write operation will not cause a write collision, at 1008, the method 1000 may then generate new OC parity code(s) based on data associated with the write operation, at 1010. When the new OC parity data is obtained, the data associated with the write operation and the new OC parity data can be written to the specific track such that the new OC parity code(s) are written in data sectors immediately following the data from the host associated with the write operation, at 1012.

When a specific write operation will cause a write collision, at 1008, the method 1000 may then perform a read-before-write operation and read the data from the whole track that has a possible write collision, at 1014. The method 1000 may then generate new parity code(s) based on data associated with the write operation and data read from the collision track(s), at 1016. When the new OC parity data is obtained, the data associated with the write operation and the new OC parity data can be written to the specific track, at 1018. In some embodiments, the method 1000 may throw away any additional OC parity data that were stored along with partial track writes and utilize an OC parity data for the whole track, such as may be implemented in a nominal track format (e.g., the format implemented in manufacturing).

In all of the discussed embodiments, there is no constraint on the number of OC parity sectors utilized prior to writing data in its final format. To account for unscanned tracks, especially in CMR implementations, more OC parity sectors are recommended to be used than would be used in normal HDD operation. In some embodiments, such as discussed with respect to FIG. 9 and FIG. 10, using more OC parity sectors can increase the probability of a collision with a subsequent write operation, however, the use of more OC parity sectors can afford significantly more protection for sectors written to unscanned tracks.

Further, in an SMR drive configuration, in which valid OC parity is constantly maintained for all sectors written to the drive, an in-field scan of unscanned tracks can be conducted with very low duty cycle, or even omitted all together, causing little to no performance degradation. In a CMR drive configuration, in which a constant maintenance of valid OC parity is more challenging, the above methods provide solutions to allow write operations to be performed to unscanned tracks one or more times, after the manufacturing format thereof, while maintaining an OC parity data. Although an in-field scan operation may eventually be required for unscanned tracks in CMR drives, the embodiments discussed herein allow for an initial period of HDD usage by an end user with no write performance loss, where scan operations may be conducted at a later time to help mitigate potential future write throughput degradation.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments can be made, and other embodiments not specifically described herein will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:
1. An apparatus comprising:
a control circuit configured to perform a parity generation process including:
 receive a write command to store first specific data to a data storage location;
 generate first parity codes for each data sector of the first specific data, the first parity codes including an inner code (IC) for each data sector of the first specific data;
 determine if there has been a prior write to the data storage location;
 when there has not been a prior write to the data storage location, generate an additional parity code based on the first specific data; and
 store the first specific data, the first parity codes, and the additional parity code to the data storage location.
2. The apparatus of claim 1 further comprising:
the data storage location is a specific track of a disc having multiple data storage tracks;
the additional parity code is an outer code (OC) parity; and
the control circuit further configured to write the additional parity code immediately following the first specific data within the specific track regardless of a location of any previously stored OC parity for the specific track.

3. The apparatus of claim 1 comprising the control circuit further configured to:
   determine when performing the write command will cause a write collision with data previously stored to the data storage location; and
   when the write command does not cause the write collision, store the first specific data, the first parity codes, and the additional parity code to the data storage location.

4. The apparatus of claim 3 comprising the control circuit further configured to:
   when the write command will cause the write collision, perform a read-before-write operation on the data storage location;
   generate new first parity codes based on the first specific data and the data previously stored at the data storage location; and
   store the first specific data and new first parity codes to the data storage location.

5. The apparatus of claim 1 further comprising the additional parity code is an outer code (OC) parity generated based on only the first specific data where no other data from the data storage location is utilized to generate the OC parity.

6. The apparatus of claim 1 comprising the control circuit further configured to generate the additional parity code based on the first specific data without reading other data from the specific data storage location.

7. The apparatus of claim 1 comprising the control circuit further configured to:
   determine when the data storage location has not been written since a last formatting event; and
   when the data storage location has not been written since the last formatting event, generate the additional parity code based on the first specific data and based on data written during the last formatting event.

8. The apparatus of claim 1 comprising the control circuit further configured to:
   when the data storage location has been written since the last formatting event:
     perform a read operation on the data storage location to obtain second specific data;
     generate the additional parity code based on the first specific data and the second specific data; and
     store the first specific data, the first parity codes, and the additional parity code to the data storage location.

9. The apparatus of claim 1 comprising the control circuit further configured to:
   determine when the first specific data will utilize a full available capacity of the data storage location; and
   when the first specific data will utilize the full available capacity of the data storage location, generate the additional parity code based on only the first specific data.

10. The apparatus of claim 1 comprising the control circuit configured to:
    determine if the data storage location was previously scanned for defects; and
    when the data storage location was not previously scanned for defects, perform the parity code generation process for the data storage location.

11. The apparatus of claim 10 comprising the control circuit configured to not perform the parity code generation process for the data storage location when the data storage location was previously scanned for defects.

12. A method comprising:
    performing, at a control circuit within a data storage device, an outer code (OC) codeword generation process including:
      determining if there has been a prior write to a specific data storage location; and
      when there has not been a prior write to the specific data storage location, generating the OC codeword based on first data to be stored at the specific data storage location.

13. The method of claim 12 further comprising:
    the specific data storage location is a track of a disc having multiple data storage tracks;
    writing the first data at a first location of the track; and
    writing the OC codeword immediately following the first data regardless of a location of any previously stored OC codeword for the track.

14. The method of claim 13 further comprising:
    determining when writing the first data will cause a write collision with data previously stored to the track;
    when writing the first data will not cause the write collision, writing the first data and the OC codeword to the track;
    when writing the first data will cause the write collision:
      performing a read operation on the track to retrieve second data;
      generating a new OC codeword based on the first data and the second data; and
      storing the first data and new OC codeword to the track.

15. The method of claim 12 further comprising:
    determining when the specific data storage location has not been written since a last formatting event;
    when the specific data storage location has not been written since the last formatting event, generating the OC codeword based on the first data and based on data written during the last formatting event;
    when the specific data storage location has been written since the last formatting event:
      performing a read operation on the specific data storage location to obtain second data;
      generating the OC codeword based on the first data and the second data; and
      storing the first data and the OC codeword to the data storage location.

16. The method of claim 12 further comprising:
    determining if the specific data storage location was previously scanned for defects;
    when the specific data storage location was not previously scanned for defects, performing the OC codeword generation process; and
    not performing the OC codeword generation process when the specific data storage location was previously scanned for defects.

17. A memory device storing instructions that when executed cause a processor to perform a method comprising:
    performing an outer code (OC) codeword generation process including:
      determining if there has been a prior write to a specific data storage location; and
      when there has not been a prior write to the specific data storage location, generating the OC codeword based on first data to be stored at the specific data storage location.

18. The memory device of claim 17 comprising the method further including:
    performing the OC codeword generation process including:

determining if the specific data storage location was previously scanned for defects;

when the specific data storage location was not previously scanned for defects, performing the OC codeword generation process; and not performing the OC codeword generation process when the specific data storage location was previously scanned for defects.

19. The memory device of claim 18 comprising the method further including:

the specific data storage location is a track of a data storage disc;

performing the OC codeword generation process including:

writing the first data at a first location of the track; and writing the OC codeword at a second location immediately following the first location regardless of any previously stored OC codeword for the track.

20. The memory device of claim 18 comprising the method further including:

performing the OC codeword generation process including:

determining when the specific data storage location has not been written since a last formatting event; and when the specific data storage location has not been written since the last formatting event, generating the OC codeword for all data within the specific data storage location including the first data and data written during the last formatting event without performing a read of the specific data storage location.

* * * * *